United States Patent
Bengough

(10) Patent No.: US 6,742,155 B2
(45) Date of Patent: May 25, 2004

(54) SYSTEM AND METHOD FOR FORWARD ERROR CORRECTION

(75) Inventor: Peter Bengough, Kanata (CA)

(73) Assignee: Catena Networks, Inc., Redwood Shores, CA (US)

( * ) Notice: Subject to any disclaimer, the term of this patent is extended or adjusted under 35 U.S.C. 154(b) by 500 days.

(21) Appl. No.: 09/814,468

(22) Filed: Mar. 21, 2001

(65) Prior Publication Data

US 2001/0039637 A1 Nov. 8, 2001

(30) Foreign Application Priority Data

Mar. 31, 2000 (CA) .............................. 2303630

(51) Int. Cl.[7] .................. G06F 11/00; H03M 13/00
(52) U.S. Cl. ........................ 714/752; 714/701
(58) Field of Search ..................... 714/701, 718, 714/748, 751, 752, 753, 755, 758, 819, 820, 821; 711/127, 157

(56) References Cited

U.S. PATENT DOCUMENTS

| | | | |
|---|---|---|---|
| 4,360,831 A | 11/1982 | Kellar | |
| 5,799,033 A * | 8/1998 | Baggen | 375/250 |
| 5,968,200 A * | 10/1999 | Amrany | 714/786 |
| 6,023,783 A | 2/2000 | Divsalar et al. | |
| 6,044,116 A | 3/2000 | Wang | |
| 6,055,277 A * | 4/2000 | Stephens et al. | 375/285 |
| 6,088,351 A | 7/2000 | Jenkin et al. | |
| 6,148,136 A | 11/2000 | Tanaka et al. | |
| 6,151,487 A | 11/2000 | Kim et al. | |
| 6,370,666 B1 * | 4/2002 | Lou et al. | 714/751 |

* cited by examiner

Primary Examiner—Christine T. Tu
(74) Attorney, Agent, or Firm—Townsend and Townsend and Crew LLP; Kenneth R. Allen

(57) ABSTRACT

A forward error correction system for reducing the transmission error in a data transmission is provided. The system comprises an encoder for encoding data, an interleaver for interleaving the encoded data to an output data stream and a first buffer for storing the interleaved data. A transmitter is operatively associated with the first buffer for transmitting the interleaved data. A deinterleaver receives and deinterleaves the transmitted interleaved data and a second buffer operatively coupled with the deinterleaver stores the deinterleaved data. A decoder operatively coupled with the second buffer decodes the deinterleaved data. The deinterleaved data is decoded without intermediate storage, reducing the storage requirements.

14 Claims, 5 Drawing Sheets

FIG. 2

SYSTEM AND METHOD FOR FORWARD ERROR CORRECTION

The following invention relates generally to the field of communication systems, and specifically a system and method for Forward Error Correction (FEC) in such systems.

BACKGROUND OF THE INVENTION

Forward Error Correction (FEC) is commonly used in communications systems to improve noise immunity and decrease the Bit Error Rate (BER). FIG. 1 illustrates a typical FEC implementation, represented generally by the numeral 10. FEC is typically achieved through the use of an encoder 12 in a transmitter 14 and a decoder 16 in a receiver 18. The purpose of the FEC encoder 12 is to add redundancy to the data stream at the transmitter 14. The FEC decoder 16 uses this knowledge at the receiver to detect and correct any transmission errors.

The area of FEC encoding has seen much research and, as a result, there exist a number of different types and classes of FEC codes. Block codes are one such class that is common in communication applications. These codes are characterized by the addition of R check bytes to each block of K information bytes. FEC block codes are designed and characterized to correct a specified number of errors within a data block of a given size. The number of errors that can be corrected depends on the number of inserted check bytes and defines the error correcting capacity of the code.

In order to increase the system's noise immunity to burst errors larger than the FEC code's correcting capacity, a technique known as interleaving is often employed in conjunction with the encoder and decoder. The purpose of interleaving is to reorder the transmitted bytes and shuffle the data over multiple codewords prior to transmission. The bytes are shuffled by an interleaver 20. At the receiver, the data is reassembled into its original order by a deinterleaver 22 prior to further processing.

The objective of interleaving on burst errors is to partition the burst into pieces and distribute the errors across multiple codewords. As long as the number of errors introduced to each codeword is smaller than the error correcting capacity of the codeword, then the decoder can correct all of the errors in the corrupted burst. This may be true even if the total size of the corrupted burst exceeds the error correcting capacity of a single codeword.

Typically, interleaving blocks are implemented with RAM and the interleaver and deinterleaver simply generate the read and write address control. The interleaver generates the write address for the RAM and interleaves the data as it is written into the RAM, while the deinterleaver generates the read address and deinterleaves the received data as it is extracted from the RAM.

Figure 2:
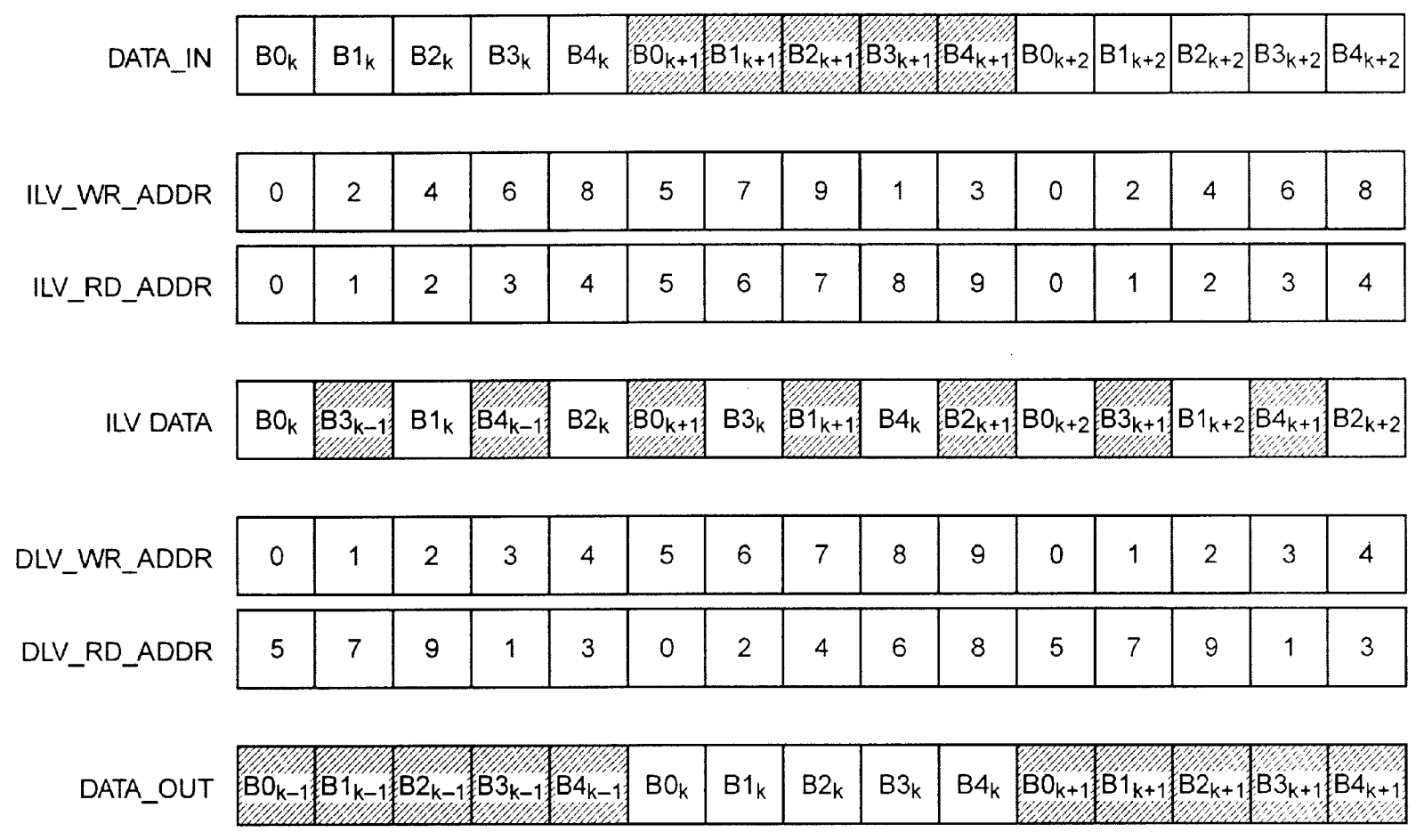

FIG. 2 exemplifies the performance of the interleaver 20 and deinterleaver 22. In this example, the FEC codewords are convolutionally interleaved by delaying the i-th codeword byte by (D−1)×i bytes, where D is the programmable interleaving depth. The deinterleaver performs the reverse operation (that is, delays the i-th codeword byte by (D−1)×(N−i) bytes, where N is the codeword length). Convolutional interleaving implies that as the k-th codeword is being transmitted, the (k−(D−1))th codeword is being received. This is the interleaving specification for G.992.2 compliant Digital Subscriber Loop (DSL) systems.

In the particular example of FIG. 2, N=5 and D=2. Therefore, for the input data stream DATA_IN, the first N (five) codeword bytes $B0_k$ through $B4_k$ (i.e., the k-th codeword $Bx_k$) become the first, third, fifth, seventh and eleventh codeword bytes of the transmitted data stream ILV DATA. The preceding N codeword bytes $B0_{k-1}$ through $B4_{k-1}$ (i.e., the (k−1)th codeword $Bx_{k-1}$) of the input data stream do not appear in the illustrated portion of DATA_IN but as they have been similarly delayed, the last two ($B3_{k-1}$ and $B4_{k-1}$) appear as the second and fourth codeword bytes of ILV DATA. Thus, as the k-th codeword $Bx_k$ is being transmitted, the (k−1)th codeword $Bx_{k-1}$ is being received.

To process a single stream of data, the RAM requirement for each of the interleaver and deinterleaver blocks is given by D×N bytes. Thus, at any instant, a quantity of RAM buffers equal to D separate FEC codewords.

It is typical to implement the interleaving and coding functions separately, including any necessary buffering, as shown in FIG. 1. The decoder 16 requires enough buffer memory to store a single FEC codeword, while the interleaver 20 and deinterleaver 22 require enough memory to store D codewords.

One of the greatest challenges facing those implementing DSL systems today is how to reduce the size of their product as well as the amount of power it consumes. However, implementing the FEC system requires both area to implement the system, as well as power to drive it. Therefore, what is needed is a device that can perform FEC while occupying less space and using less power than current implementations.

It is an object of the present invention to obviate or mitigate at least some of the above disadvantages.

BRIEF SUMMARY OF THE INVENTION

In accordance with the present invention, there is provided a forward error correction system for reducing the transmission error in a data transmission. The system comprises an encoder for encoding input data, an interleaver for interleaving the encoded data to an output data stream and a first buffer operatively associated with the interleaver for storing the interleaved data. A transmitter is operatively associated with the first buffer for transmitting the interleaved data. A deinterleaver deinterleaves the transmitted interleaved data received from the transmitter and a second buffer operatively coupled with the deinterleaver stores the deinterleaved data. A decoder operatively coupled with the second buffer decodes the deinterleaved data. The deinterleaved data is decoded without intermediate storage.

In accordance with a further aspect of the present invention, there is provided a forward error correction encoder for receiving a plurality of different data streams and reducing the transmission error in a data transmission. The forward error correction encoder comprises a plurality of interleavers, each associated with respective ones of the data streams for interleaving data and a plurality of buffers associated with respective ones of the interleavers for storing the interleaved data. A plurality of deinterleavers is operatively associated with the buffers for providing deinterleaved data. An encoder encodes the deinterleaved data, and the encoded data is coupled with respective ones of the data streams. A transmitter is operatively associated with the buffers for transmitting the interleaved encoded data.

BRIEF DESCRIPTION OF THE DRAWINGS

An embodiment of the invention will now be described by way of example only, with reference to accompanying drawings in which:

FIG. 2 is a block diagram illustrating the flow of information from the input to the output of the interleaving stages;

DETAILED DESCRIPTION OF THE INVENTION

Figure 1:
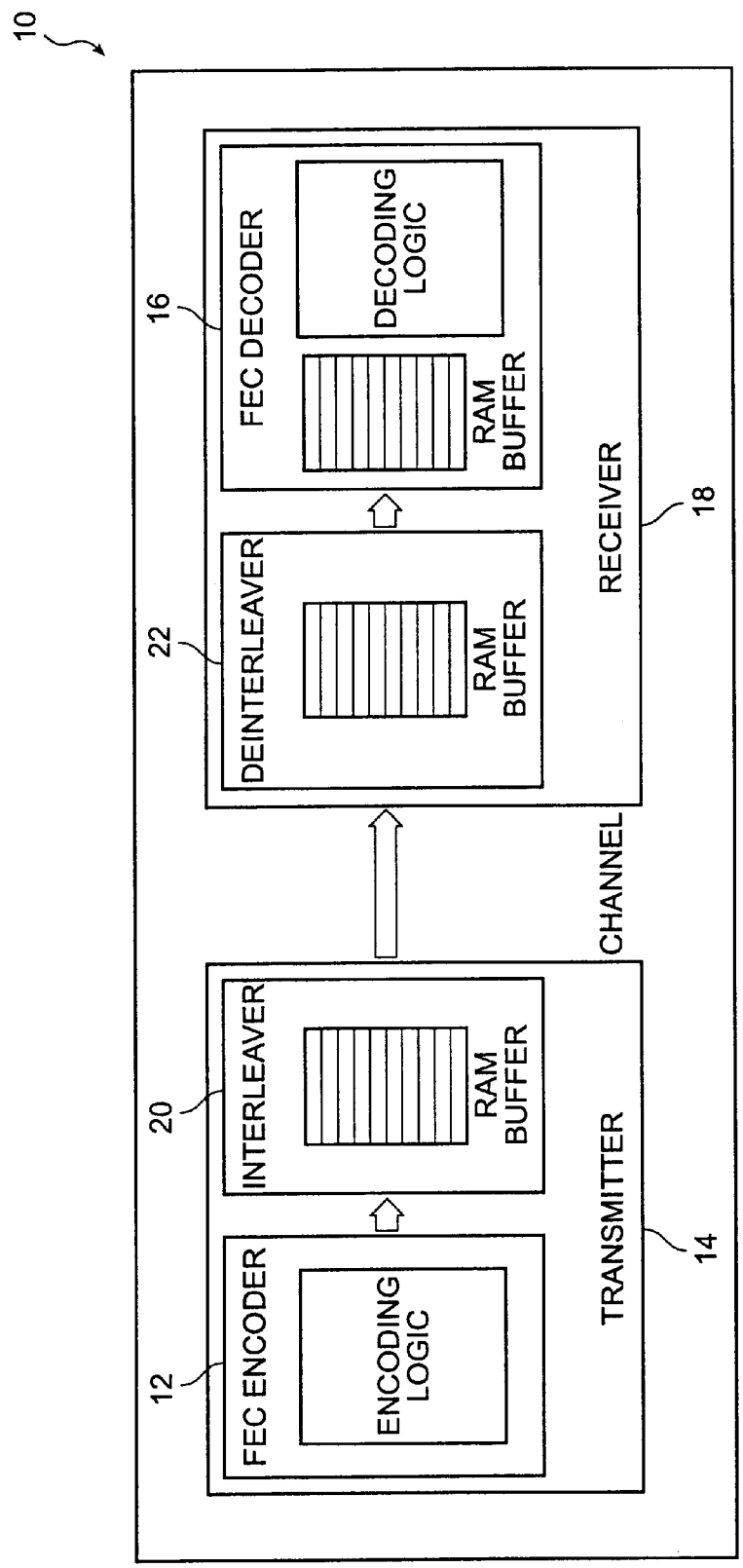
FIG. 1 is a block diagram of a typical FEC system.

For convenience, like numerals refer to like structures in the drawings.

By taking advantage of each block's data processing requirements, as well as the allocation of internal memory, the buffering component of the decoder and the deinterleaver can be combined. Combining the buffer in this manner reduces the total memory requirements and improves the processing efficiency of the FEC blocks.

Figure 3:
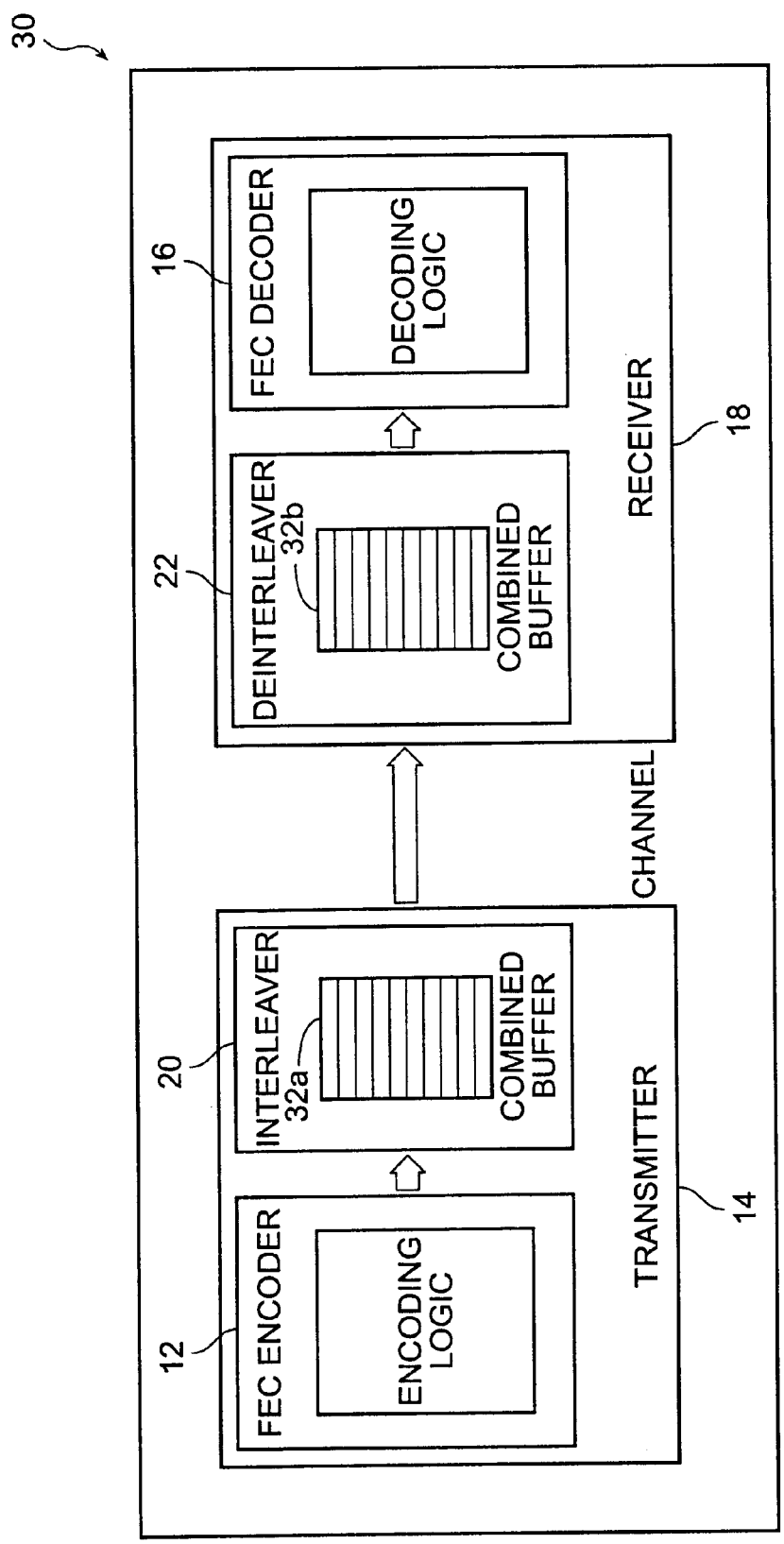
FIG. 3 is a block diagram of a FEC implementation according to an embodiment of the present invention.

Referring to FIG. 3, a FEC system in accordance with an embodiment of the invention is represented generally by the numeral 30. The FEC system 30 has a transmitter 14 and a receiver 18, coupled via a communication channel. The transmitter 14 includes an encoder 12 and an interleaver 20. The receiver 18 includes a decoder 16 and a deinterleaver 22. There is a combined buffer 32a in the interleaver 20 and another combined buffer 32b in the deinterleaver 22.

Data being transmitted is encoded by the FEC encoder 12 and interleaved into the transmitter's combined buffer 32a. The transmitter's combined buffer 32a resides in the interleaving block 20 and is used to store interleaved data. It is possible to encode the codewords fast enough that a buffer before the encoder 12 is not necessary.

The deinterleaver 22 at the receiver receives data as it arrives and deinterleaves it into the combined buffer 32b. Once a complete codeword has been received, the decoder 16 reads the deinterleaved codeword. The decoder 16 reads the codeword once to prepare for the decoding process. Once the decoder 16 has performed the necessary computations, it reads the codeword a second time to decode it.

The decoder 16 should be able to operate fast enough such that while it is preparing to decode a particular codeword, the codeword is not overwritten by another incoming codeword. That is, the decoder 16 should operate faster than the time it takes to receive one complete codeword. If the decoder 16 cannot operate fast enough, the codeword will be overwritten and data will be lost.

Implemented this way, data is received and buffered by the deinterleaving block 22. The data is not extracted from the buffer 32b and presented as an output until the full output codeword is available in the buffer 32b. Hence, the output is systematically stalled, and data builds up in the deinterleaving buffer 32b until a full codeword is available for the decoding block 16 to process, without the need for a codeword buffer before the decoder (as in FIG. 1).

In an alternate embodiment, a buffer is desirable for storing the data before it is encoded. The buffer allows the FEC encoding to be deferred until a full codeword is available. This buffer is particularly useful for multiple channel applications in which data arrives at the encoder in bursts. In order to operate properly the encoder has to store its state while it is in between bursts. To maintain the state of the encoder, it is necessary to provide a separate state register or encoder for each channel. Therefore, in order to facilitate resource sharing of the FEC encoder for multiple channel applications, the data is buffered until a full codeword is available. The encoder can then completely encode the data for each channel in turn.

Figure 4:
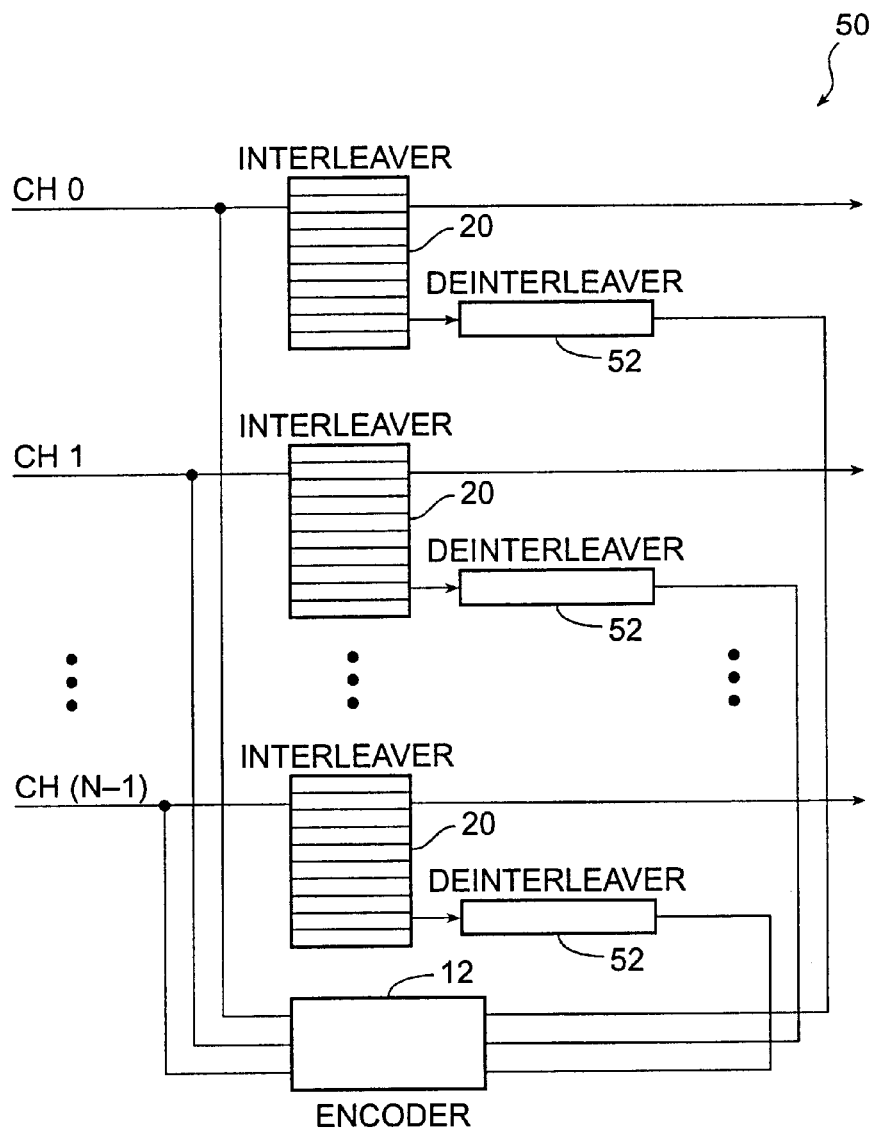
FIG. 4 is a block diagram of the transmitter end of a FEC implementation according to an alternate embodiment of the invention.

Referring to FIG. 4, a system for buffering data according to the present embodiment of the invention is represented generally by the numeral 50. The buffering system 50 is for implementation at the transmitter. The system has N channels (CH0 to CH(N−1)). Each channel includes an interleaver 20 and a deinterleaver 52. The deinterleaver 52 couples the interleaver 20 with an encoder 12. The channels share the encoder 12.

Each burst of data is stored directly into the interleaver 20 as it arrives. Once the entire codeword has been received it is processed by the encoder 12. However, since the data bursts are stored directly in the interleaver 20, the data is not stored contiguously. Therefore, the deinterleaver 52 is required to provide the addresses of the different segments that constitute an entire codeword. The addition of the deinterleaver 52 at this stage is inexpensive due to the fact that a majority of its components are already present for the interleaver 20 and may be shared.

Figure 5:
FIG. 5 is a block diagram of an encoded codeword.

In the present embodiment, FEC encoding is accomplished by the addition of check bytes to the codeword. FIG. 5 illustrates a codeword 62 with check bytes 64. The check bytes 64 are simply appended to the codeword 62. Therefore, the encoder simply reads the codeword 62 from the interleaver buffer 32 and does not need to remove it for alteration. Instead, once the codeword 62 has been encoded, the check bytes 64 are simply interleaved into the combined buffer 32a in the interleaver 20. It is, therefore, preferred that the encoder 12 process the codeword in each channel before the data burst for the next codeword arrives. This allows the check bytes to sequentially follow the last burst of input data that is stored in the interleaver buffer.

Figure 6A:
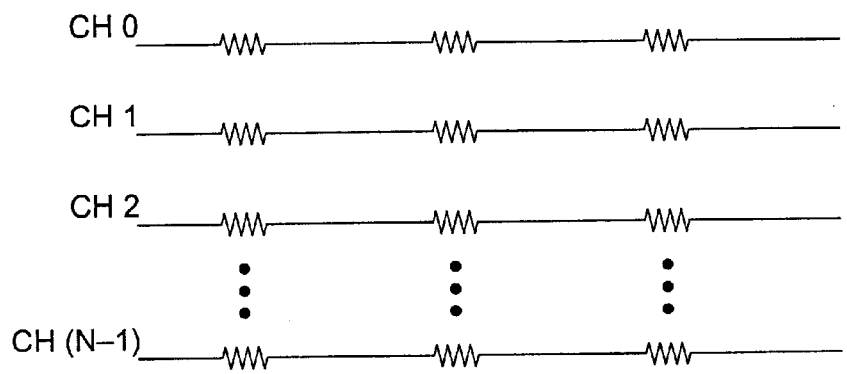
FIG. 6A is a graph of transmission channels with synchronized data bursts.

Referring to FIG. 6A, a synchronous data arrival pattern is shown. Therefore, it is preferable that the encoder 12 can process the data for all N channels in the time between the last burst of data in one codeword and the first burst of data in the next codeword. However, it is possible that the encoder can only process N/2 codewords between bursts. Although this would require more complicated addressing on the part of the interleaver, it is still possible as long as it takes at least 2 bursts to receive an entire codeword. It is also possible that the encoder process fewer codewords between bursts as long as all N channels are completed in the time it takes to receive a complete codeword.

Figure 6B:
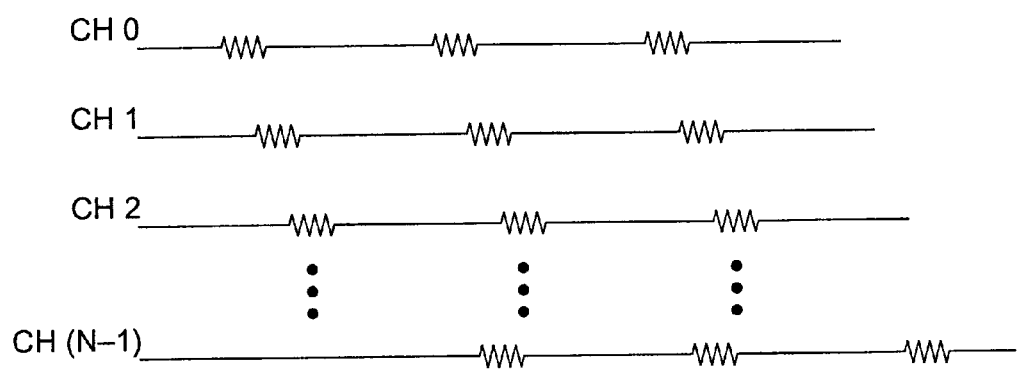
FIG. 6B is a graph of transmission channels with staggered data bursts.

Referring to FIG. 6B, a staggered data arrival pattern is shown. The encoder 12 is arranged so that it encodes the channels in the order in which their codewords are completed. Again, it is preferable that the encoder processes all N channels in the time between the last burst of data in one codeword and the first burst of data in the next codeword. It is also possible to process fewer codewords between bursts as long as all N channels are completed in the time it takes to receive a complete codeword.

At the receiver end, the deinterleaver as described in the previous embodiment (see FIG. 3) is used.

Although not preferable, it possible that the encoder cannot process all N channels in the time between the last burst of data in one codeword and the first burst of data in the next codeword. In such a situation, a controller is used for controlling the timing and determining when a codeword in the buffer is ready to be encoded and when it is ready to be transmitted.

With respect to physical memory, no buffer RAM is required by the encoder and decoder blocks, while the memory requirements of the interleaver and deinterleaver remain unchanged. This, in turn, reduces silicon area, cost, and power.

With regard to improved processing efficiency, fewer total clock cycles are consumed in processing a stream of data, since data is not transferred from one RAM to another. This advantage can either allow for reduced power in single channel applications, or increased performance in multiple channel applications (since a larger number of data streams can be processed consecutively in the same number of clock cycles).

In yet an alternate embodiment, if burst data for a codeword arrives before a previous codeword has been FEC encoded, it is still possible to implement the system described in the previous embodiment. However, the interleaving controls need to be more sophisticated since the check block no longer sequentially follows the last burst of data of the codeword it is derived from.

The FEC design described in the above embodiments may be used in a wide variety of systems including Discrete Multi Tone based communication systems (G.lite (G.992.2) compliant communication systems, G.dmt (G.992.1) compliant communication systems, G.bis compliant communication systems and the like) and QAM-based communication systems.

Furthermore, the systems described in the above embodiments refer specifically to FEC encoding using a systematic code with check bytes. This invention is in no way limited to the use of systematic block encoding only. How the system may be implemented with other encoding methods will be apparent to a person skilled in the art without departing from the spirit and scope of the invention as outlined in the claims appended hereto.

What is claimed is:

1. A forward error correction system for reducing transmission errors in a data transmission, comprising:
   an encoder coupled to encode input data;
   an interleaver coupled to interleave the encoded data;
   a first combined buffer operatively associated with said interleaver and configured to store the interleaved encoded data;
   a transmitter operatively associated with said first buffer and configured to transmit the interleaved encoded data;
   a deinterleaver coupled to deinterleave the interleaved encoded data received from said transmitter;
   a second combined buffer operatively coupled with said deinterleaver and configured to store the deinterleaved encoded data; and
   a decoder directly coupled with said second buffer and configured to decode the deinterleaved encoded data.

2. The forward error correction system of claim 1, wherein the interleaved encoded data is transmitted in a single data stream.

3. The forward error correction system of claim 1, wherein said data transmission is a discrete multi-tone (DMT) based communication system.

4. The forward error correction system of claim 3, wherein said DMT based communication system is one of a G.lite (G.992.2) compliant communication system, a G.dmt (G.992.1) compliant communication system, and a G.bis compliant communication system.

5. The forward error correction system of claim 1, wherein said data transmission is a QAM-based communication system.

6. A forward error correction encoder for encoding a plurality of data streams and reducing transmission errors in a data transmission, said forward error correction encoder comprising:
   a plurality of interleavers, each associated with a respective one of said plurality of data streams and configured to interleave data;
   a plurality of buffers, each associated a respective one of said plurality of interleavers and configured to store the interleaved data;
   a plurality of deinterleavers operatively associated with said plurality of buffers and configured to generate deinterleaved data from the interleaved data;
   an encoder coupled to encode the deinterleaved data from each of said plurality of deinterleavers and to provide each encoded deinterleaved data to said plurality of interleavers; and
   a transmitter operatively associated with said plurality of buffers and configured to transmit each interleaved encoded data.

7. The forward error correction encoder of claim 6, wherein the interleaved encoded data from each of said plurality of buffers is transmitted together in a single data stream.

8. A forward error correction system for reducing transmission errors in a data transmission, comprising:
   an encoder coupled to encode input data;
   an interleaver coupled to interleave the encoded data;
   a first combined buffer operatively associated with said interleaver and configured to store the interleaved encoded data;
   a transmitter operatively associated with said first buffer and configured to transmit the interleaved encoded data;
   a deinterleaver coupled to deinterleave the interleaved encoded data received from said transmitter;
   a second combined buffer operatively coupled with said deinterleaver and configured to store the deinterleaved encoded data; and
   a high-speed decoder operatively coupled with said second buffer and configured to decode the deinterleaved encoded data, wherein said high-speed decoder operates to decode a current codeword faster than a time period required to receive a next codeword.

9. The forward error correction system of claim 8, wherein said high-speed decoder is directly coupled with said second combined buffer.

10. A forward error correction encoder for encoding a plurality of data streams and reducing transmission errors in a data transmission, said forward error correction encoder comprising:
    a plurality of interleavers, each associated with a respective one of said plurality of data streams;
    a plurality of buffers, each associated a respective one of said plurality of interleavers;
    a plurality of deinterleavers operatively associated with said plurality of buffers;
    an encoder coupled to receive an output from said plurality of deinterleavers and to provide an input to said plurality of interleavers; and a transmitter operatively associated with said plurality of buffers, wherein each of said plurality of interleavers is configured to interleave an associated one of said plurality of data streams to form an interleaved data portion, wherein each of said plurality of buffers is configured to store an associated interleaved data portion, wherein each of said plurality of deinterleavers is configured to deinterleave the stored interleaved data portion from an associated one of said plurality of buffers, wherein said encoder is configured to encode the deinterleaved data portion from each of said plurality of deinterleavers, wherein each of said plurality of interleavers is further configured to interleave an associated encoded deinterleaved data portion, wherein each of said plurality of buffers is further configured to store the interleaved encoded data portion from an associated one of said plurality of interleavers, and wherein said transmitter is configured to transmit the interleaved encoded data portion from each of said plurality of buffers.

11. A method of encoding a plurality of data streams and reducing transmission errors in a data transmission, comprising the acts of:

interleaving said plurality of data streams to form a plurality of interleaved data portions;

storing said plurality of interleaved data portions;

deinterleaving the stored interleaved data portions;

encoding the deinterleaved data portions;

interleaving the encoded deinterleaved data portions;

storing the interleaved encoded data portions; and transmitting the interleaved encoded data portions.

12. The method of claim 11, wherein each of said plurality of interleaved data portions is associated with exactly one of said plurality of data streams.

13. The method of claim 12, wherein each of the interleaved encoded data portions is associated with exactly one of said plurality of data streams.

14. The method of claim 11, wherein said plurality of data streams are separately interleaved to form said plurality of interleaved data portions.

\* \* \* \* \*